(12) United States Patent
Heo et al.

(10) Patent No.: US 8,859,161 B2
(45) Date of Patent: Oct. 14, 2014

(54) PROTON CONDUCTIVE INORGANIC THIN FILM, METHOD OF FORMING THE SAME, AND FUEL CELL INCLUDING THE PROTON CONDUCTIVE INORGANIC THIN FILM

(75) Inventors: Pil-won Heo, Yongin-si (KR); Sang-kyun Kang, Seoul (KR); Tae-young Kim, Seoul (KR); Jin-su Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 170 days.

(21) Appl. No.: 13/180,968

(22) Filed: Jul. 12, 2011

(65) Prior Publication Data

US 2012/0040273 A1    Feb. 16, 2012

(30) Foreign Application Priority Data

Aug. 12, 2010 (KR) .......................... 10-2010-0077817
Mar. 24, 2011 (KR) .......................... 10-2011-0026460

(51) Int. Cl.
| | | |
|---|---|---|
| H01M 8/10 | (2006.01) | |
| H01M 8/12 | (2006.01) | |
| C23C 14/34 | (2006.01) | |
| C23C 14/08 | (2006.01) | |

(52) U.S. Cl.
CPC ............ *H01M 8/1016* (2013.01); *H01M 8/124* (2013.01); *Y02E 60/525* (2013.01); *C23C 14/3414* (2013.01); *H01M 8/1097* (2013.01); *C23C 14/08* (2013.01); *Y02E 60/523* (2013.01)
USPC ........................................................ 429/495

(58) Field of Classification Search
None
See application file for complete search history.

(56) References Cited

U.S. PATENT DOCUMENTS

| | | |
|---|---|---|
| 2006/0166064 A1 | 7/2006 | Huang et al. |
| 2010/0092832 A1 | 4/2010 | Lee et al. |

FOREIGN PATENT DOCUMENTS

| | | |
|---|---|---|
| JP | 2008-53224 | 3/2008 |
| JP | 2008-84788 | 4/2008 |
| JP | 2009-158130 | 7/2009 |
| JP | 2009-252418 | 10/2009 |
| KR | 10-2007-0027741 | 3/2007 |
| KR | 10-2010-0041348 | 4/2010 |
| WO | WO 2009/134297 | 11/2009 |
| WO | WO 2010/044538 | 4/2010 |

OTHER PUBLICATIONS

Genzaki, K. et al. "Proton Conductivity and Solid Acidity of Mg-, In-, and Al-Doped $SnP_2O_7$", Journal of the Electrochemical Society, Electrochemical Society, Manchester, New Hampshire, US, vol. 156, No. 7, May 6, 2009, pp. B806-B810.

Extended European Search Report, dated Dec. 30, 2011, issued in corresponding European Application No. 11177413.9-2119.

Pilwon Heo et al., "Intermediate-temperature fuel cells with amorphous $Sn0.9In0.1P2O7$ thin film," Journal of Power Sources, vol. 198, 2012, pp. 117-121.

(Continued)

*Primary Examiner* — Patrick Ryan
*Assistant Examiner* — Wyatt McConnell
(74) *Attorney, Agent, or Firm* — Cantor Colburn LLP

(57) ABSTRACT

A proton-conductive inorganic thin film including an inorganic proton conductor, a method of forming the proton-conductive inorganic thin film, and a fuel cell including the proton-conductive inorganic thin film as an electrolyte membrane.

19 Claims, 11 Drawing Sheets

(56) References Cited

OTHER PUBLICATIONS

Masahiro Nagao et al., "A Proton-Conducting $In^{3+}$-Doped $SnP_2O_7$ Electrolyte for Intermediate-Temperature Fuel Cells", *Electrochemical and Solid-State Letters*, 9 (3) A105-A109 (2006).

Pilwon Heo et al., "$Sn_{0.9}In_{0.1}P_2O_7$-Based Organic/Inorganic Composite Membranes Application to Intermediate-Temperature Fuel Cells", *Journal of the Electrochemical Society*, 154 (1) B63-B67 (2007).

Pilwon Heo et al., "Proton Conduction in $Sn_{0.95}Al_{0.05}P_2O_7$—PBI—PTFE Composite Membrane", *Electrochemical and Solid-State Letters*, 11 (6) B91-B95 (2008).

Xilin Chen et al., "An Oxide Ion and Proton Co-Ion Conducting $Sn_{0.9}In_{0.1}P_2O_7$ Electrolyte for Intermediate-Temperature Fuel Cells", *Journal of the Electrochemical Society* 155 (12) B1264-B1269 (2008).

X. Wu et al., "A Sb-doped $SnP_2O_7$ Solid Proton Conductor for Intermediate Temperature Fuel Cells", Fuel Cells 00, 0000, No. 0, 453-458, (2008).

PROTON CONDUCTIVE INORGANIC THIN FILM, METHOD OF FORMING THE SAME, AND FUEL CELL INCLUDING THE PROTON CONDUCTIVE INORGANIC THIN FILM

CROSS-REFERENCE TO RELATED APPLICATION

This application claims the benefit of Korean Patent Application Nos. 10-2010-0077817, filed on Aug. 12, 2010, and 10-2011-0026460, filed Mar. 24, 2011 in the Korean Intellectual Property Office, the disclosures of which are incorporated herein by reference.

BACKGROUND

1. Field

Aspects of the present disclosure relate to a proton conductive inorganic thin film, a method of forming the proton conductive inorganic thin film, and a fuel cell including the proton conductive inorganic thin film.

2. Description of the Related Art

According to types of an electrolyte and fuel used, fuel cells can be classified as polymer electrolyte membrane fuel cells (PEMFCs), direct methanol fuel cells (DMFCs), phosphoric acid fuel cells (PAFCs), molten carbonate fuel cells (MCFCs), or solid oxide fuel cells (SOFCs).

SOFCs are known to be suitable for use in decentralized power supplies, due to their high electrical efficiency and operability with a variety of fuels, including lower purity gaseous fuels. However, for operation at high temperatures, SOFCs need to be formed of a high-priced material durable against high-temperature environments, and it is not easy to rapidly switch from ON to OFF and vice versa. In this sense, SOFCs are not suitable for various applications, such as portable or vehicular power sources. Therefore, research for operating SOFCs at low temperatures is being actively conducted.

PEMFCs operating at 100° C. or higher temperatures in non-humidified conditions, as compared to those operable at low temperatures, do not need a humidifier, and are known to be convenient in terms of control of water supply and highly reliable in terms of system operation. Furthermore, such PEMFCs may become more durable against carbon monoxide (CO) poisoning that may occur with fuel electrodes as they operate at high temperatures, and thus, a simplified reformer may be used therefor. These advantages mean that PEMFCs are increasingly drawing attention for use in such high-temperature, non-humidified systems.

Along with the current trends for lowering the operation temperature of SOFCs and increasing the operation temperature of PEMFCs as described above, fuel cells operable in a moderate temperature range are drawing more attention.

However, electrolyte membranes of fuel cells that have been developed so far do not exhibit satisfactory proton conductivities at moderate temperatures, and thus, still demand further improvement.

SUMMARY

Aspects of the present invention provide a proton-conductive inorganic thin film having good proton conductivity, a method of forming the proton-conductive inorganic thin film, and a fuel cell including the proton-conductive inorganic thin film and having improved efficiency An aspect of the present invention provides a proton-conductive inorganic thin film comprising an inorganic proton conductor represented by Formula 1 below:

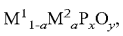  Formula 1 wherein
$M^1$ is a tetravalent metallic element;
$M^2$ is at least one metal selected from the group consisting of a monovalent metallic element, a divalent metallic element, and a trivalent metallic element;
$0 \leq a < 1$;
x is a number from 1.5 to 3.5; and
y is a number from 5 to 13.

Another aspect of the present invention provides a method of forming the proton-conductive inorganic thin film, the method comprising vapor-depositing an inorganic proton conductor represented by Formula 1 below, on a substrate:

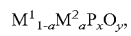  Formula 1 wherein
$M^1$ is a tetravalent metallic element;
$M^2$ is at least one metal selected from the group consisting of a monovalent metallic element, a divalent metallic element, and a trivalent metallic element;
$0 \leq a < 1$;
x is a number from 1.5 to 3.5; and
y is a number from 5 to 13.

Another aspect of the present invention provides a fuel cell that includes the proton-conductive inorganic thin film.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings, of which.

DETAILED DESCRIPTION

Figure 1:
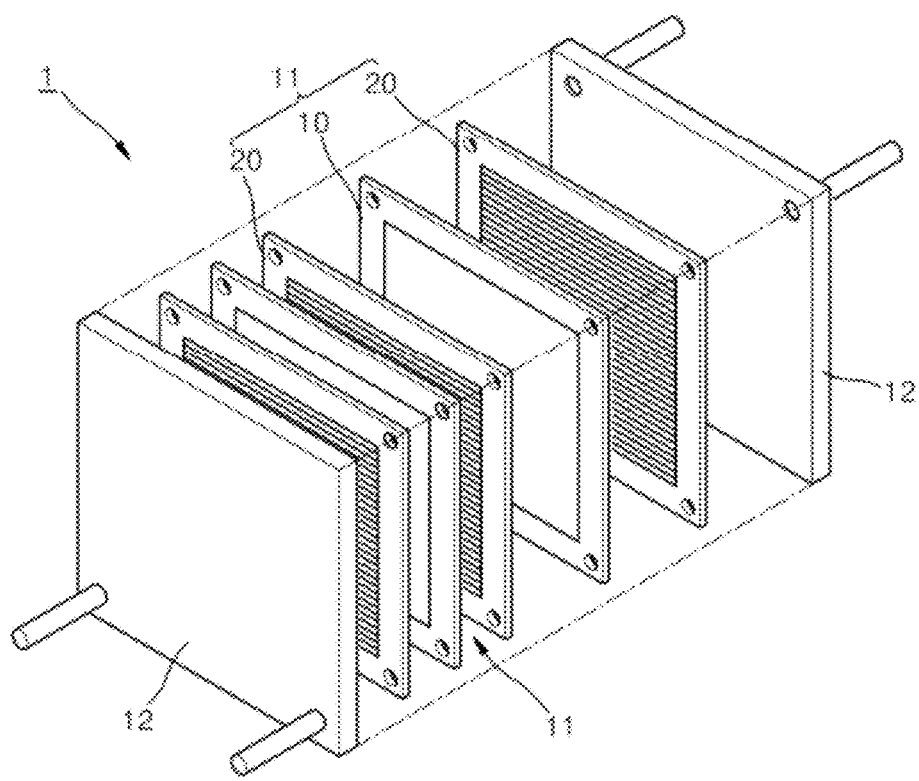
FIG. 1 is a perspective exploded view of a fuel cell according to an embodiment of the present invention.

Reference will now be made in detail to the present embodiments of the present invention, examples of which are illustrated in the accompanying drawings, wherein like reference numerals refer to like elements throughout. The embodiments are described below in order to explain the present invention by referring to the figures.

According to an exemplary embodiment of the present invention, a proton-conductive inorganic thin film includes an inorganic proton conductor represented by Formula 1 below:

$$M^1_{1-a}M^2_a P_x O_y \quad \text{Formula 1}$$

In Formula 1, $M^1$ is a tetravalent metallic element;
$M^2$ is at least one selected from the group consisting of a monovalent metallic element, a divalent metallic element, and a trivalent metallic element;
a satisfies $0 \leq a < 1$;
x is a number from 1.5 to 3.5; and
y is a number from 5 to 13.

The term "proton-conductive inorganic thin film" used herein indicates a membrane including an inorganic proton conductor having proton conductivities and the membrane may have a markedly smaller thickness and a higher density, as compared to typical inorganic electrolyte membranes.

The proton-conductive inorganic thin film may have any thickness. For example, the proton-conductive inorganic thin film may have a thickness of about 0.05 μm to about 10 μm for example, a thickness of about 0.1 μm to about 1 μm. When the thickness of the proton-conductive inorganic thin film is within these ranges, the density and proton conductivity of the proton-conductivity inorganic thin film may be good.

The proton-conductive inorganic thin film may be so dense as to be nearly gas-impermeable. For example, the proton-conductive inorganic thin film may have a density of about 2.7 g/cm³ or greater, for example, a density of about 2.7 g/cm³ to about 3.7 g/cm³. The density is determined by measuring the weight per unit area of the proton-conductive inorganic thin film.

When the thickness of the proton-conductive inorganic thin film is within these ranges, it may have an open circuit voltage (OCV) of about 0.9 V or greater at 200° C. and an area specific resistance (ASR) of about 0.01 Ωcm² to about 1 Ωcm² at 200° C. The OCV is a factor indicating the proton conductivity and density of the proton-conductive inorganic thin film. The sheet resistance depends on the resistance of films constituting the fuel cell. The greater the conductivities of the films and the smaller the thicknesses of the films, the smaller the ASR.

The proton-conductive inorganic thin film has an amorphous phase, which can be identified by X-ray diffraction analysis.

In the proton-conductive inorganic thin film having the amorphous phase, interatomic links forming a proton conductor are maintained as in a crystalline phase, so P—O links are still present, enabling protons to pass and conduct. Simultaneously the amorphous phase of the proton-conductive inorganic thin film may suppress defects and pores occurring in the thickness direction of films, and may lower the grain-boundary resistance, thereby improving the OCV and ASR characteristics of the proton-conductive inorganic thin film.

A main peak having a Bragg angle of 2θ for a CuK-α X-ray wavelength of 1.541 Å does not appear in the region where a crystalline phase of $SnP_2O_7$ would be present. The main peak having a Bragg angle of 2θ for a CuK-α X-ray wavelength of 1.541 Å appears broadly in a range of about 15 degrees to about 40 degrees.

In the region including the crystalline phase of the $SnP_2O_7$, a Bragg angle of 2θ for a CuK-α X-ray wavelength of 1.541 Å is in a range of about 15 degrees to about 25 degrees, or a range of about 30 degrees to about 40 degrees.

In Formula 1 above, $M^1$ is a metallic element with tetravalent cations. For example, $M^1$ may be at least one metal selected from the group consisting of tin (Sn), zirconium (Zr), tungsten (W), silicon (Si), molybdenum (Mo), and titanium (Ti). For another example, $M^1$ may be tin (Sn).

In Formula 2 above, $M^2$ is a metallic element with monovalent, divalent or trivalent cations. For example, $M^2$ may be at least one metal selected from the group consisting of lithium (Li), sodium (Na), potassium (K), rubidium (Rb), cesium (s), beryllium (Be), magnesium (Mg), calcium (Ca), strontium (Sr), barium (Ba), indium (In), aluminum (Al), and antimony (Sb).

In the inorganic proton conductor of Formula 1, $M^1$ with tetravalent cations is partially substituted with $M^2$, which is a monovalent, divalent or trivalent metal.

In Formula 1, a may be a number from 0.01 to 0.7. For example, a may be a number from 0.05 to 0.5. Alternatively, a may be a number from 0.1 to 0.4.

In Formula 1 above, x may be 2, and y may be 7. For example, if $M^1$ is tin (Sn), and $M^2$ is indium (In), the inorganic proton conductor of Formula 1 may be, for example, $Sn_{1-a}In_a P_2 O_7$.

Examples of the inorganic proton conductor of Formula 1 include $Sn_{0.9}In_{0.1}P_2O_7$, $Sn_{0.95}Al_{0.05}P_2O_7$, $Ti_{0.9}In_{0.1}P_2O_7$, $Ti_{0.95}Al_{0.05}P_2O_7$, $Zr_{0.9}In_{0.1}P_2O_7$, $Zr_{0.95}Al_{0.05}P_2O_7$, $W_{0.9}In_{0.1}P_2O_7$, $W_{0.95}Al_{0.05}P_2O_7$, $Sn_{0.7}Li_{0.3}P_2O_7$, $Sn_{0.95}Li_{0.05}P_2O_7$, $Sn_{0.9}Li_{0.1}P_2O_7$, $Sn_{0.8}Li_{0.2}P_2O_7$, $Sn_{0.6}Li_{0.4}P_2O_7$, $Sn_{0.5}Li_{0.5}P_2O_7$, $Sn_{0.7}Na_{0.3}P_2O_7$, $Sn_{0.7}K_{0.3}P_2O_7$, $Sn_{0.7}Cs_{0.3}P_2O_7$, $Zr_{0.9}Li_{0.1}P_2O_7$, $Ti_{0.9}Li_{0.1}P_2O_7$, $Si_{0.9}Li_{0.1}P_2O_7$, $Mo_{0.9}Li_{0.1}P_2O_7$, $W_{0.9}Li_{0.1}P_2O_7$, $Sn_{0.7}Mg_{0.3}P_2O_7$, $Sn_{0.95}Mg_{0.05}P_2O_7$, $Sn_{0.9}Mg_{0.1}P_2O_7$, $Sn_{0.8}Mg_{0.2}P_2O_7$, $Sn_{0.6}Mg_{0.4}P_2O_7$, $Sn_{0.5}Mg_{0.5}P_2O_7$, $Sn_{0.7}Ca_{0.3}P_2O_7$, $Sn_{0.7}Sr_{0.3}P_2O_7$, $Sn_{0.7}Ba_{0.3}P_2O_7$, $Zr_{0.9}Mg_{0.1}P_2O_7$, $Ti_{0.9}Mg_{0.1}P_2O_7$, $Si_{0.9}Mg_{0.1}P_2O_7$, $Mg_{0.9}Mg_{0.1}P_2O_7$, $W_{0.9}Mg_{0.1}P_2O_7$, $Zr_{0.7}Mg_{0.3}P_2O_7$, $Ti_{0.7}Mg_{0.3}P_2O_7$, $Si_{0.7}Mg_{0.3}P_2O_7$, $Mg_{0.7}Mg_{0.3}P_2O_7$, and $W_{0.7}Mg_{0.3}P_2O_7$.

Hereinafter, a method of preparing the inorganic proton conductor of Formula 1 and a method of forming a proton-conductive inorganic thin film including the inorganic proton conductor, according to embodiments of the present invention, will now be described.

Initially, a tetravalent metallic element $M^1$ precursor, at least one metallic ($M^2$) precursor selected from the group consisting of a monovalent metallic precursor, a divalent metallic precursor, and a trivalent metallic precursor, and phosphoric acid are mixed, and a solvent is added thereto to obtain a mixture. The mixture is mixed to prepare a composition for forming the inorganic proton conductor of Formula 1.

For example, the solvent may be deinoized water, methanol, ethanol, or isopropyl alcohol. The amount of the solvent may be in a range of about 300 to about 800 parts by weight based on 100 parts by weight of the $M^1$ precursor. When the amount of the solvent is within this range, the viscosity of the composition may be appropriate to handle for the preparation of the inorganic proton conductor of Formula 1.

The composition is stirred at a temperature of about 200° C. to about 300° C. When the composition is stirred within this temperature range, the components of the composition are uniformly mixed, and water is removed from the composition, so that the viscosity of the composition is maintained appropriately. When the viscosity of the composition is adjusted as described above, a subsequent thermal treatment process may be efficiently performed, without the composition undergoing phase separation.

Subsequently, the composition is thermally treated at a temperature of about 300° C. to about 1200° C., for example, at 650° C. The resulting product is ground into powder of a certain particle size, thereby completing the preparation of the inorganic proton conductor of Formula 1.

Examples of the $M^1$ precursor include $M^1$ oxides, $M^1$ chlorides, and $M^1$ hydroxides. For example, the $M^1$ precursor may include at least one compound selected from the group consisting of tin oxides (for example, $SnO_2$), tin chlorides (for example, $SnCl_4$ and $SnCl_2$), tin hydroxides (for example, $Sn(OH)_4$), tungsten oxides (for example, $WO_2$ and $WO_3$), tungsten chlorides (for example, $WCl_4$), molybdenum oxides (for example, $MoO_2$), molybdenum chlorides (for example, $MoCl_3$), zirconium oxides (for example, $ZrO_2$), zirconium chlorides (for example, $ZrCl_4$), zirconium hydroxides (for example, $Zr(OH)_4$), titanium oxides (for example, $TiO_2$), and titanium chlorides (for example, $TiCl_2$ and $TiCl_3$).

Examples of the $M^2$ precursor include $M^2$ oxides, $M^2$ chlorides, $M^2$ hydroxides, and $M^2$ nitrates. For example, the $M^2$ precursor may include indium hydroxide, indium chloride, aluminum hydroxide, aluminum chloride, antimony hydroxide, antimony chloride, lithium hydroxide ($LiOH.H_2O$), lithium oxide ($Li_2O$), lithium chloride (LiCl), lithium nitrate ($LiNO_3$), sodium hydroxide (NaOH), sodium chloride (NaCl), potassium hydroxide (KOH), potassium chloride (KCl), rubidium hydroxide ($RbOH.XH_2O$), rubidium chloride (RbCl), cesium hydroxide ($CsOH.H_2O$), cesium chloride (CsCl), beryllium chloride ($BeCl_2$), magnesium hydroxide ($Mg(OH)_2$), magnesium oxide (MgO), calcium hydroxide ($Ca(OH)_2$), calcium chloride ($CaCl_2$), strontium hydroxide ($Sr(OH)_2$), strontium chloride ($SrCl_2$), barium hydroxide ($Ba(OH)_2$), barium chloride ($BaCl_2$), or a mixture thereof.

The amount of the $M^2$ precursor may be from about 5 mol % to about 50 mol %, based on the total amount of the $M^1$ precursor and the $M^2$ precursor. When the amount of the $M^2$ precursor is within this range, the inorganic proton conductor of Formula 1 may be obtained.

About 80 to 100 wt % of an aqueous phosphoric acid solution may be used as the phosphoric acid. If 85 wt % of an aqueous phosphoric acid solution is used, the amount of the phosphoric acid may be from about 200 parts to about 300 parts by weight, based on 100 parts by weight of the $M^1$ precursor. When the amount of the phosphoric acid is within this range, this may facilitate the preparation of the inorganic proton conductor of Formula 1, taking into consideration the loss of phosphoric acid during the thermal treatment process of the composition for forming the inorganic proton conductor.

When the thermal treatment temperature of the composition is within the range defined above, the inorganic proton conductor of Formula 1, having good proton conductivity, may be obtained substantially without having to perform structural changes. The thermal treatment time varies depending on the thermal treatment temperature. For example, the thermal treatment time may be from about 1 hour to about 5 hours. The thermal treatment may be performed in an inert gas atmosphere or in an air atmosphere.

In the process of grinding into powder, the average particle diameter obtained is not particularly limited. For example, the product from the thermal treatment may be ground so as to have an average particle diameter of about 50 nm to about 5000 nm.

According to some embodiments, a proton-conductive inorganic thin film may be formed by depositing the inorganic proton conductor of Formula 1 on a substrate.

The deposition may be performed by physical chemical vapor deposition (CVD).

Examples of physical CVD include sputtering, pulsed laser deposition (PLD), molecular beam epitaxy (MBE), ion plating, ion beam deposition, and the like.

According to some embodiments, the deposition may be performed by sputtering, for example, reactive sputtering.

The substrate may be any suitable substrate. For example, the substrate may be a silicon wafer, an anode, or the like, which may be selectively chosen according to the process of manufacturing the proton-conductive inorganic thin film.

A method of forming the proton-conductive inorganic thin film by reactive sputtering, according to an embodiment of the present invention, will now be described.

Initially, the inorganic proton conductor of Formula 1 ground to a powder having an average particle diameter as defined above is press-molded and then thermally treated to form a sintered product.

In the process of press-molding the inorganic proton conductor of Formula 1 in powder form, for example, a cold isobaric press may be used to form the powder into a disc shape having a diameter of about 1 inch to about 2 inches. For example, the press-molded product may have a diameter of about 2 inches.

The thermal treatment may be performed at a temperature of about 900° C. to 1500° C. For example, the thermal treatment may be performed at about 1200° C. When the thermal treatment temperature is within this range, the resulting sintered product may be strong enough to be used as a sputter target.

Subsequently, the sintered product is bound to a support plate as a sputter target, and then sputtering is performed on the sputter target. For example, the support plate may be a copper plate.

The sputtering is performed in a mixed gas atmosphere containing about 10% to about 20% of oxygen by volume and about 80% to about 90% of an inert gas by volume. When the amount of oxygen is within this range, the resulting proton-conductive inorganic thin film may have good proton conductivity.

Examples of the inert gas include argon gas, nitrogen gas, and the like. The sputtering may be performed at a pressure of about 3 mTorr to about 10 mTorr. When the pressure is within this range, the resulting proton-conductive inorganic thin film may be dense.

For example, the sputtering conditions may include a power of about 30 W to about 120 W, a sputter target-to-substrate distance of about 50 mm to about 120 mm, and a deposition time of about 100 min to about 1000 min. When the sputtering conditions are within these ranges, the resulting proton-conductive inorganic thin film may be amorphous and may be dense.

The sputtering may be followed by thermal treatment, which may be performed at a temperature lower than 700° C. For example, the thermal treatment may be performed at a temperature of about 200° C. to about 600° C. The proton-conductive inorganic thin film may have a more uniform composition after the thermal treatment. When the thermal treatment temperature is within these ranges, the target proton-conductive inorganic thin film may be amorphous and may be dense.

Another exemplary embodiment of the present invention provides a proton-conductive inorganic thin film having an amorphous phase that may be formed by deposition as described above.

The proton-conductive inorganic thin film obtained from the above-described processes may have a thickness of about 0.05 μm to about 10 μm, for example, a thickness of about 0.1 μm to about 1 μm. The proton-conductive inorganic thin film may have a density of about 2.7 g/cm$^3$ or greater, for example, a density of about 2.7 g/cm$^3$ to about 3.7 g/cm$^3$.

The proton-conductive inorganic thin film may be a non-humidified proton conductor. The proton-conductive inorganic thin film may be used in fuel cells operating at a moderate temperature in non-humidified conditions. The term "moderate temperature" refers to a temperature of about 150° C. to about 400° C.; however, the moderate temperature is not particularly limited.

Another exemplary embodiment of the present invention provides a fuel cell that is a thin film fuel cell including the proton-conductive inorganic thin film as an electrolyte membrane between a cathode and an anode. The thin film fuel cell may have high efficiency characteristics as it exhibits good OCV and ASR characteristics at moderate temperatures in non-humidified conditions.

The fuel cell may be used for any purpose. For example, the fuel cell may be used to implement a solid oxide fuel cell (SOFC), a proton exchange membrane fuel cell (PEMFCs), and the like.

Figure 2:
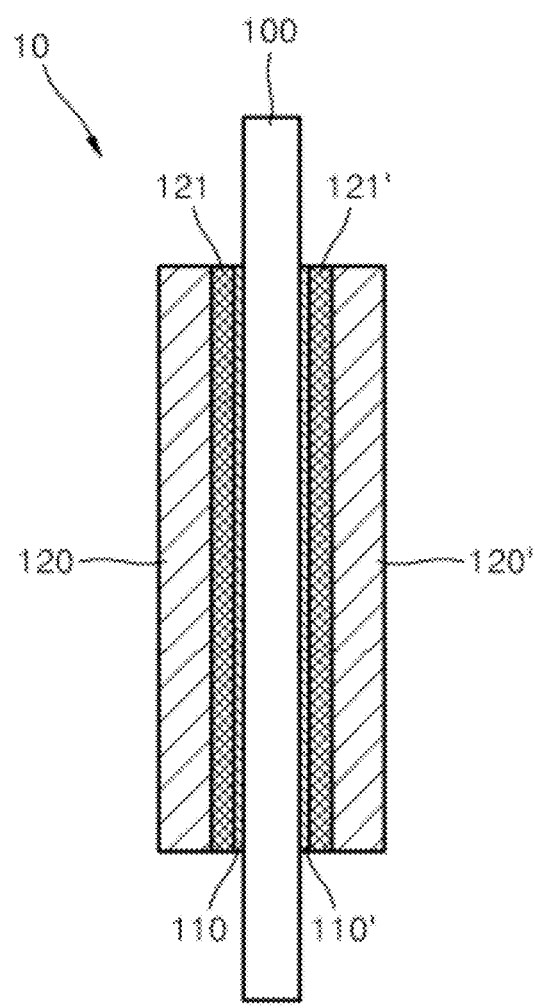
FIG. 2 is a cross-sectional diagram of a membrane-electrode assembly (MEA) of the fuel cell of FIG. 1.

FIG. 1 is a perspective exploded view of a fuel cell 1 according to an embodiment of the present invention. FIG. 2 is a cross-sectional diagram of a membrane-electrode assembly (MEA) of the fuel cell 1 of FIG. 1.

Referring to FIG. 1, the fuel cell 1 includes two unit cells 11 that are supported by a pair of holders 12. Each unit cell 11 includes an MEA 10, and bipolar plates 20 disposed on lateral sides of the MEA 10. Each bipolar plate 20 includes a conductive metal, carbon or the like, and operates as a current collector, while providing oxygen and fuel to the catalyst layers of the corresponding MEA 10.

Although only two unit cells 11 are shown in FIG. 1, the number of unit cells is not limited to two and a fuel cell may have several tens or hundreds of unit cells, depending on the required properties of the fuel cell.

As shown in FIG. 2, the MEA 10 includes an electrolyte membrane 100, catalyst layers 110 and 110' disposed on lateral sides of the electrolyte membrane 100, and first gas diffusion layers 121 and 121' respectively stacked on the catalyst layers 110 and 110', and second gas diffusion layers 120 and 120' respectively stacked on the first gas diffusion layers 121 and 121'.

The electrolyte membrane 100 includes the proton-conductive inorganic thin film according to embodiments of the present invention. The catalyst layers 110 and 110' respectively operate as a fuel electrode and an oxygen electrode, each including a catalyst and a binder therein. The catalyst layers 110 and 110' may further include a material that may increase the electrochemical surface area of the catalyst.

The first gas diffusion layers 121 and 121' and the second gas diffusion layers 120 and 120' may each be formed of a material such as, for example, carbon sheet or carbon paper. The first gas diffusion layers 121 and 121' and the second gas diffusion layers 120 diffuse oxygen and fuel supplied through the bipolar plates 20 into the entire surfaces of the catalyst layers 110 and 110'.

The fuel cell 1 including the MEA 10 operates at a temperature of, for example, about 150° C. to about 300° C. Fuel such as hydrogen is supplied through one of the bipolar plates 20 into a first catalyst layer 110, and an oxidant such as oxygen is supplied through the other bipolar plate 20 into a second catalyst layer 110'. Then, hydrogen is oxidized into protons in the first catalyst layer 110, and the protons are conducted to the second catalyst layer 110' through the electrolyte membrane 100. Then, the protons electrochemically react with oxygen in the second catalyst layer 110' to produce water and electrical energy. Hydrogen produced by reforming hydrocarbons or alcohols may be used as the fuel. Oxygen may be used as the oxidant and may be supplied in the form of air.

Hereinafter, one or more exemplary embodiments of the present invention will be described in detail with reference to the following examples. These examples are not intended to limit the purpose and scope of the one or more exemplary embodiments of the present invention.

Preparation Example 1

Preparation of $Sn_{0.9}In_{0.1}P_2O_7$ $SnO_2$, $In_2O_3$, and 85 wt % of $H_3PO_4$ were mixed in a molar ratio of Sn:In:P=0.9:0.1:2.0~2.8. Deionized water was added to the mixture and then stirred at about 250° C. to obtain a mixed paste having a high viscosity. The amount of $In_2O_3$ was 5 mol %, and the amount of $SnO_2$ was 90 mol %. The mixed paste was thermally treated in an alumina crucible at 650° C. for 2.5 hours.

The product in lump form resulting from the thermal treatment was ground with a mortar to prepare $Sn_{0.9}In_{0.1}P_2O_7$ as a milk-white powder. The composition of the $Sn_{0.9}In_{0.1}P_2O_7$ was identified by ion coupled plasma atomic emission spectrometry (ICP-AES). In anticipation of the partial loss of phosphoric acid during the thermal treatment process, an initial amount of phosphoric acid added to the inorganic proton conductor was determined to have a final stoichiometric composition of $Sn_{0.9}In_{0.1}P_2O_7$ (Sn:In:P=0.9:0.1:2).

Preparation Example 2

Synthesis of $Sn_{0.7}Li_{0.3}P_2O_7$ $Sn_{0.7}Li_{0.3}P_2O_7$ was synthesized in the same manner as in Preparation Example 1, except that $LiOH.H_2O$ was used instead of $In_2O_3$, and the amounts of $SnO_2$, $LiOH.H_2O$, and $H_3PO_4$ were adjusted to have a final stoichiometric composition of $Sn_{0.7}Li_{0.3}P_2O_7$ (Sn:Li:P=0.7:0.3:2).

Example 1

Manufacture of $Sn_{0.9}In_{0.1}P_2O_7$ (SIPO) Proton-Conductive Inorganic Thin Film A $Sn_{0.9}In_{0.1}P_2O_7$ (hereinafter, "SIPO") sputter target was manufactured from the $Sn_{0.9}In_{0.1}P_2O_7$ of Preparation Example 1, according to the following processes. SIPO powder was press-molded into a disc structure having a diameter of about 2 inches. The press-molding was performed using a cold isostatic press.

The press-molded disc structure was thermally treated at 1200° C. to obtain a SIPO sintered product. Then, a copper (Cu) back plate was bonded to a back surface of the sintered product to obtain a SIPO sputter target.

A disc-shaped silicon wafer substrate (having a thickness of about 300 um and a diameter of about 2 inches) was used as a substrate of a thin film fuel cell to be manufactured. The distance between the substrate and the sputter target was adjusted to about 120 mm.

A SIPO proton-conductive inorganic thin film was formed on the substrate to a thickness of about 420 nm (0.42 µm) by performing sputtering on the SIPO sputter target. The sputtering was performed in a mixed gas atmosphere of oxygen and argon in a volume ratio of 10:90 for about 900 minutes. In the sputtering process the deposition rate was about 4.6 Å/min, and the vacuum pressure was about 5 mmTorr.

Example 2

Manufacture of Proton-Conductive Inorganic Thin Film and Thin Film Fuel Cell Including the Proton-Conductive Inorganic Thin Film A thin film fuel cell was manufactured using the SIPO sputter target of Example 1, according to the following processes. A porous alumina substrate (having a thickness of about 100 um, a disc diameter of about 25 mm or about 13 mm, and a pore diameter of about 80 nm) was used as a substrate of the thin film fuel cells to be manufactured. Sputtering was performed using a high-purity platinum (Pt) sputter target at a power of 100 W for 40 minutes to form a Pt anode having a thickness of about 200 nm on the substrate. The sputtering was performed at a vacuum pressure of about 5 mTorr in an argon gas atmosphere, wherein the distance between the porous alumina substrate and the sputter target was about 120 mm.

A SIPO proton-conductive inorganic thin film was formed on the anode to a thickness of about 420 nm (0.42 µm) by performing sputtering on the SIPO sputter target. The sputtering was performed in a mixed gas atmosphere of oxygen and argon in a volume ratio of 10:90 for about 900 minutes. In the sputtering process the sputtering the deposition rate was about 4.6 Å/min, the vacuum pressure was about 5 mmTorr, and the distance between the porous alumina substrate and the sputter target was about 120 mm.

The SIPO proton-conductive inorganic thin film was used as an electrolyte membrane. A cathode was formed on the SIPO electrolyte membrane to a thickness of about 180 nm by performing sputtering on a high-purity Pt sputter target, thereby completing the manufacture of the thin film fuel cell. The sputtering was performed at a power of 100 W and a vacuum pressure of about 50 mTorr in an argon gas atmosphere for about 30 minutes, wherein the distance between the porous alumina substrate and the sputter target was about 120 mm. The cathode and the anode each had an area of about 0.0225 cm$^2$.

The deposition conditions of the anode, the electrolyte membrane, and the cathode are summarized in Table 1.

TABLE 1

| | Power (W) | Gas atmosphere | Sputtering time (min) | Vacuum pressure (mTorr) | Target-to-substrate distance (mm) |
|---|---|---|---|---|---|
| Pt-anode | 100 | Ar | 40 | 5 | 120 |
| SIPO proton-conductive inorganic thin film | 60 | O$_2$ and Ar in a ratio of 10:90 by volume | 900 | 5 | 120 |
| Pt-cathode | 100 | Ar | 30 | 50 | 120 |

Example 3

Manufacture of SIPO Proton-Conductive Inorganic Thin Film

A SIPO electrolyte membrane was manufactured in the same manner as in Example 2, except that thermal treatment was performed at about 600° C. in an air atmosphere for 2 hours after the sputtering of the SIPO sputter target in the mixed gas atmosphere of O$_2$ and Ar in a ratio of 10:90 by volume.

Comparative Example 1

Manufacture of SIPO Press-Molded Product and Fuel Cell Using the SIPO Press-Molded Product The $Sn_{0.9}In_{0.1}P_2O_7$ (SIPO) powder of Preparation Example 1 was further ground with a mortar and then press-molded under a pressure of about $2 \times 10^3$ kg/cm$^2$ to obtain a SIPO press-molded product as a pellet having a diameter of about 12 mm. The thickness of the pellet was about 0.5 mm (about 500 µm).

The pellet was used as an electrolyte membrane, and Pt/C-coated carbon papers (electrodes available from BASF, 10 wt % Pt/C, 0.6 mg of Pt/cm$^2$) were attached to opposite sides of the electrolyte membrane to manufacture a cell. The cell was placed between two Pt-mesh current collectors to form a Pt-mesh/cell/Pt-mesh stack. While the stack was placed between upper and lower alumina tubes, the structure was gas-sealed by coating and drying an inorganic sealant on the structure.

In order to test the performance of the fuel cell, non-humid H$_2$ and non-humid air were supplied to the anode and the cathode, respectively, at about 50 ccm and about 100 ccm. The densities of the proton-conductive inorganic thin film of Example 2 and the press-molded pellet of Comparative Example 1 were measured. As a result, the proton-conductive inorganic thin film of Example 2 had a density of about 3.2 g/cm$^3$, and the press-molded product of Comparative Example 1 had a density of about 2.24 g/cm$^3$.

Cell Performance Test Method

The performances of the fuel cells of Examples 2 and 3 and the fuel cell of Comparative Example 1 were tested as follows. Initially, each $Sn_{0.9}In_{0.1}P_2O_7$ (SIPO) thin film fuel cell was loaded on a jig. A Pt wire was connected to the anode of the thin film fuel cell using a Ag paste to collect current from the anode. A boundary region of the thin film fuel cell was coated with a sealant and then dried, thereby gas-sealing the thin film fuel cell.

A Pt wire was brought into contact with the cathode to act as a probe point to collect current from the cathode. In order to test the performance of the fuel cell, non-humid H$_2$ and non-humid air were supplied to the anode and the cathode, respectively, at about 50 ccm and about 100 ccm.

The open circuit voltage (OCV) and current density-voltage (I-V) characteristics of each fuel cell were measured using a potentio-galvanostat. The area specific resistance (ASR) of each electrolyte membrane was measured at a frequency of about $0.1 \sim 1 \times 10^6$ Hz, and an amplitude of about 10 mV using a 4-probe AC impedance method.

Figure 3:
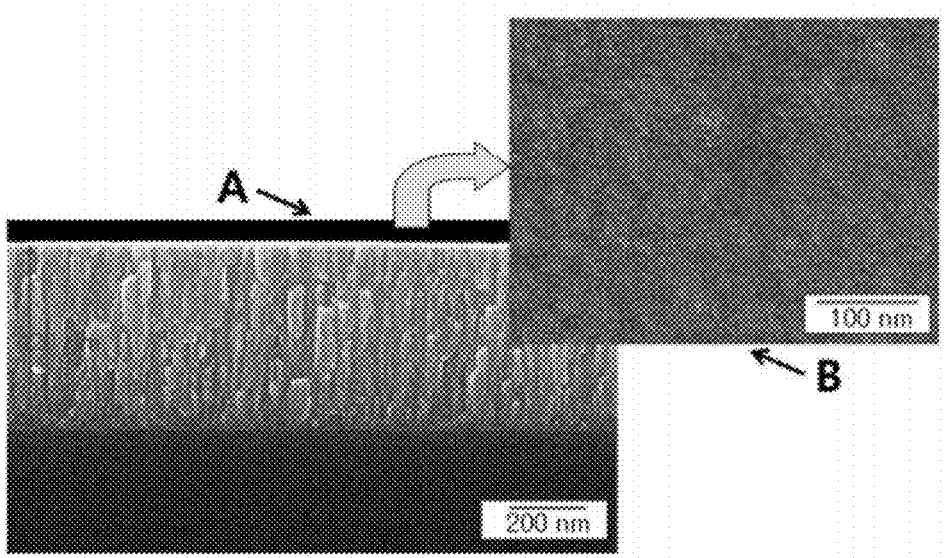
FIG. 3 is a scanning electron microscopic (SEM) image of a $Sn_{0.9}In_{0.1}P_2O_7$ (SIPO) electrolyte membrane of the embodiment of Example 1.

The condition of the SIPO proton-conductive inorganic thin film of Example 1 was observed by using scanning electron microscopy (SEM). The results are shown in FIG. 3. In FIG. 3, "A" is a cross-sectional image, and "B" is a surface image.

Figure 4:
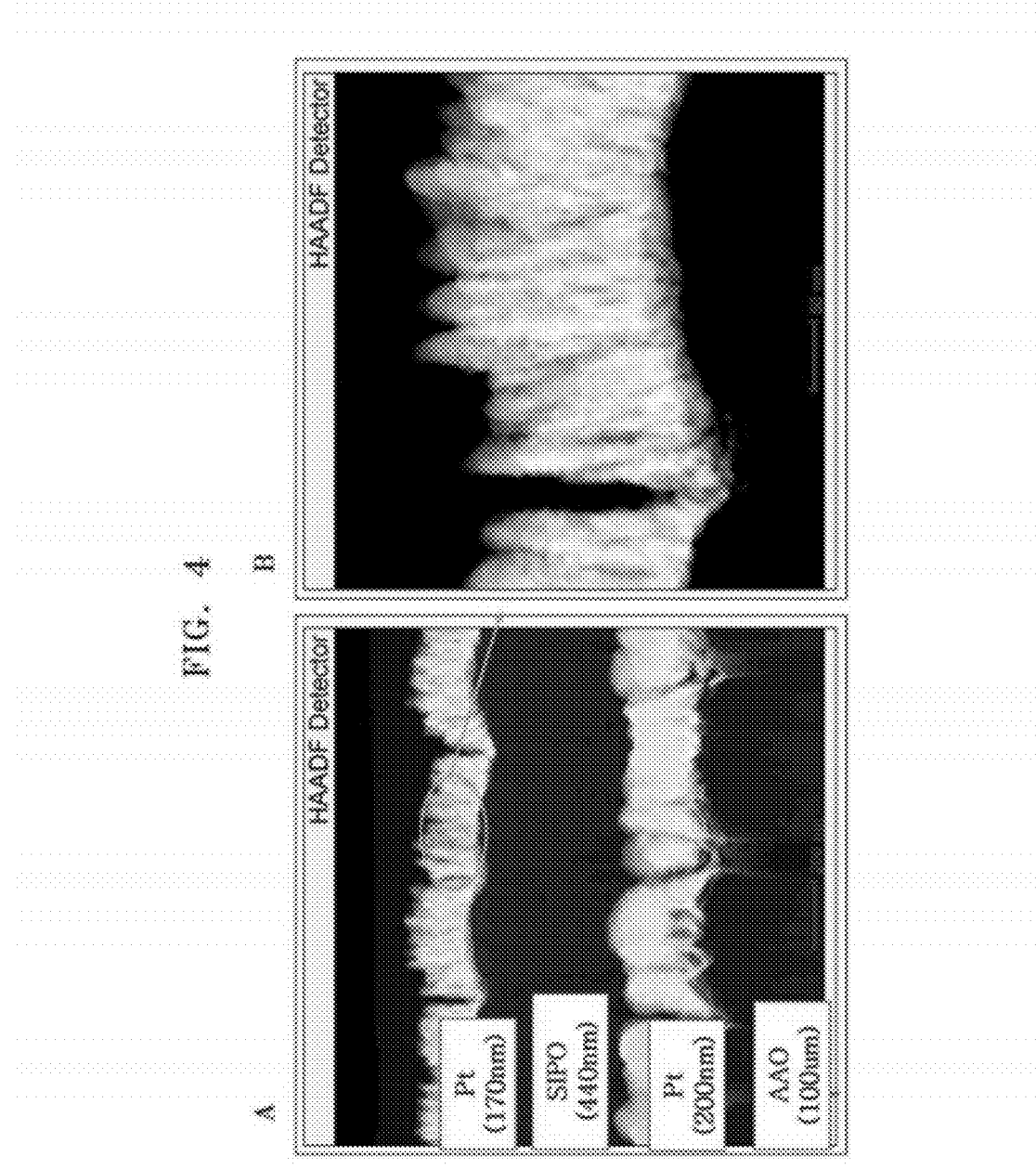
FIG. 4 is a transmission electron microscopic (TEM) image of a SIPO proton-conductive inorganic thin film formed according to Example 2.

The proton-conductive inorganic thin film of Example 2 was analyzed by using transmission electron microscopy (TEM). The results are shown in FIG. 4. In FIG. 4, "A" is a cross-sectional image, and "B" is a surface image. Referring to FIGS. 3 and 4, the SIPO proton-conductive inorganic thin films of Examples 1 and 2 are found to be dense.

Figure 5:
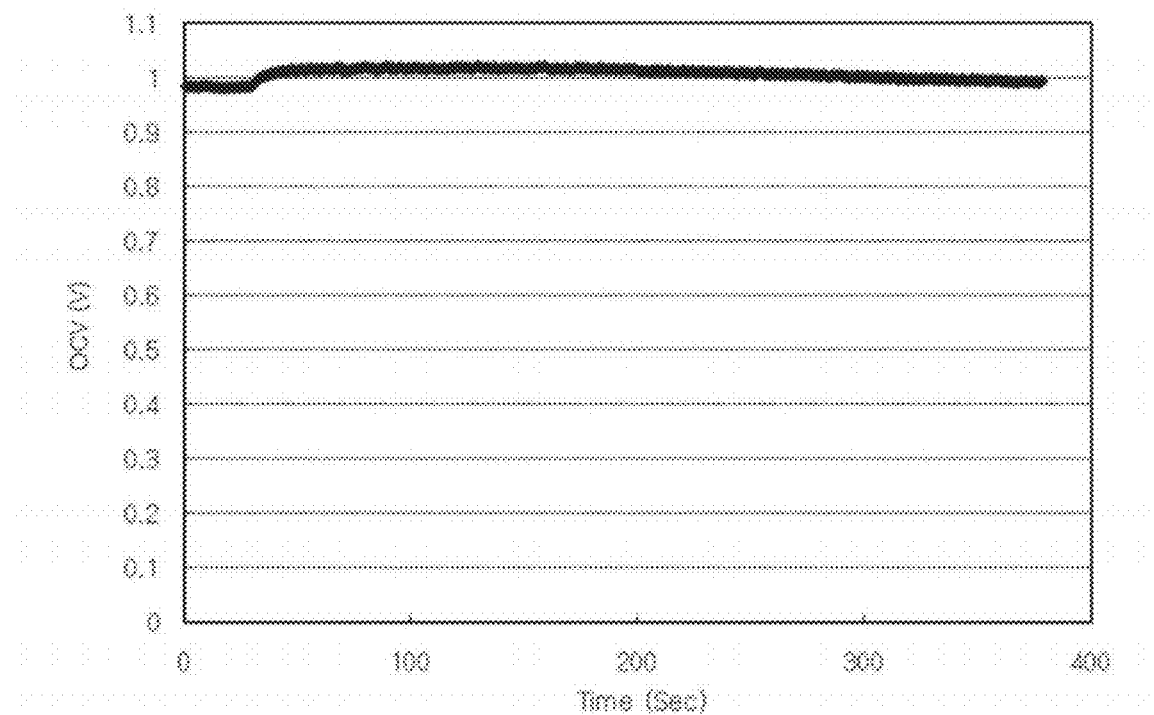
FIG. 5 is a graph showing open circuit voltage (OCV) characteristics of a fuel cell of Example 2.

The OCV characteristics of the fuel cell of Example 2 were measured. The results are shown in FIG. 5. Referring to FIG. 5, the OCV of the fuel cell of Example 1 is maintained at 1.05 V at 200° C., which indicates good CVD characteristics.

Figure 6:
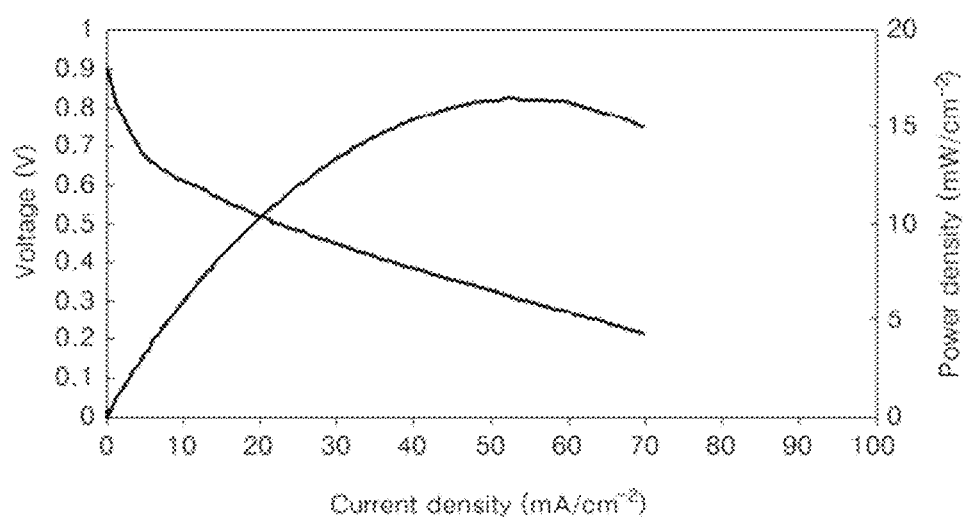
FIG. 6 is a graph showing current density-voltage characteristics and power density of the fuel cell of Example 2.

The current density-voltage characteristics (IV curve) and power density of the fuel cell of Example 2 were measured. The results are shown in FIG. 6. Referring to FIG. 6, the fuel cell of Example 2 exhibits good power density characteristics with respect to a current increase.

OCV changes in the fuel cells of Example 2 and Comparative Example 1 with respect to the thicknesses of the SIPO electrolyte membranes of the fuel cells were measured, wherein the SIPO electrolyte membrane of Comparative Example 1 was a SIPO press-molded product as described above. The results are shown in FIGS. 7A and 7B.

Figure 7A:
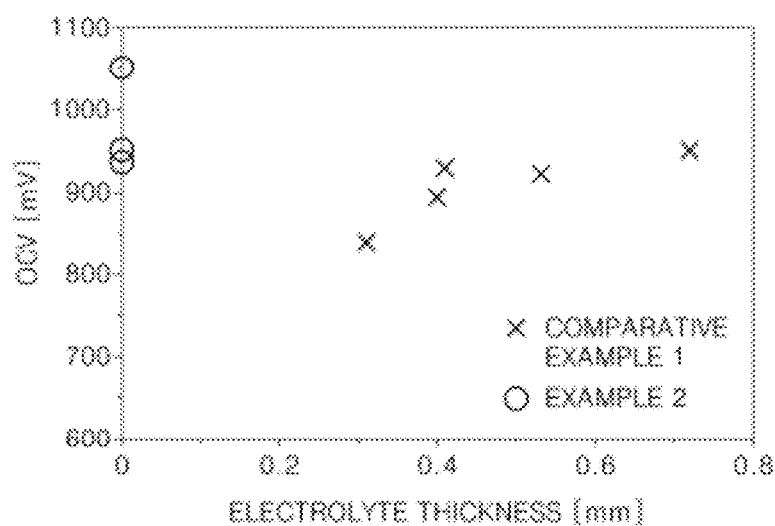
FIGS. 7A and 7B are graphs of OCV versus electrolyte membrane thickness of the fuel cells of Example 2 and Comparative Example 1.
Figure 7B:
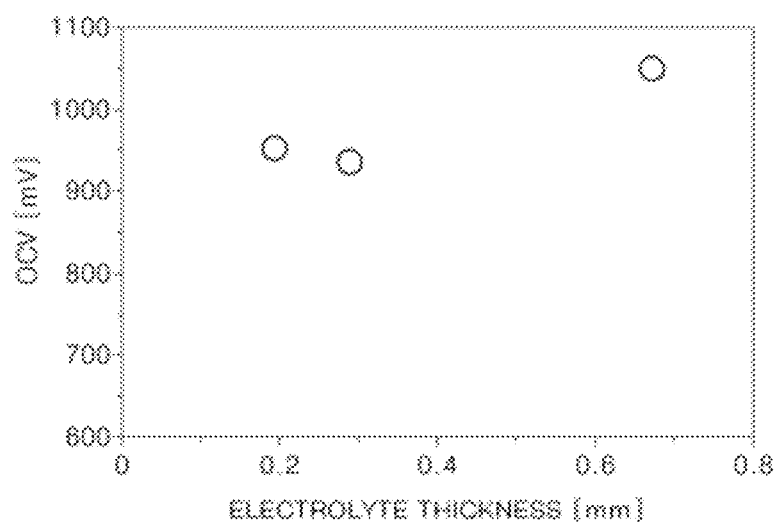

Referring to FIG. 7A, for the fuel cell of Comparative Example 1, including the SIPO press-molded product as its electrolyte membrane, its OCV dropped from 0.95 V to 0.84 V as the thickness of the SIPO press-molded electrolyte membrane was reduced from about 0.8 mm to about 0.2 mm. In contrast, referring to FIGS. 7A and 7B, the OCV of the fuel cell of Example 2 was as high as about 1.05 V even at a very small thickness of 420 nm of its SIPO electrolyte membrane.

Figure 8A:
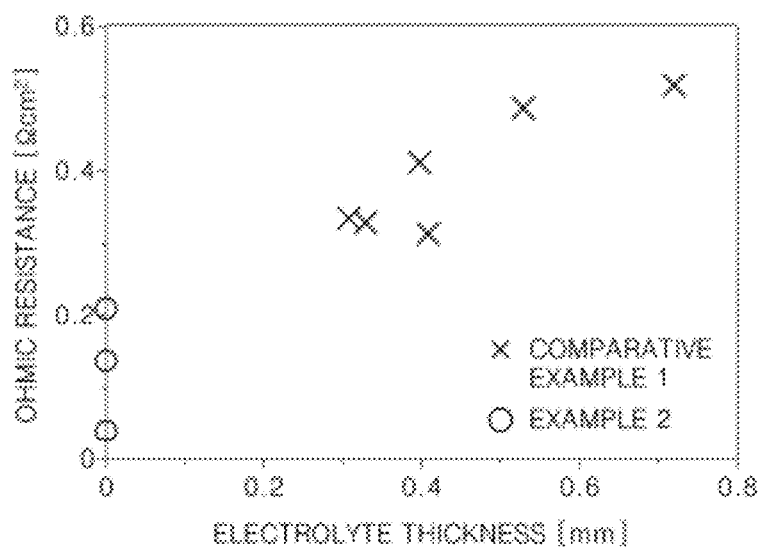
FIGS. 8A and 8B are graphs of area specific resistance (ASR) versus electrolyte membrane thickness of the fuel cells of Example 2 and Comparative Example 1.
Figure 8B:
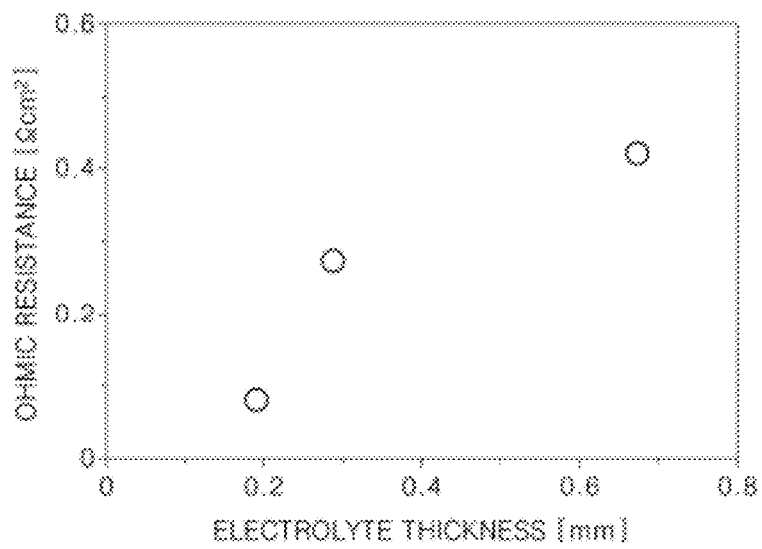

ASR changes in the fuel cells of Example 2 and Comparative Example 1 with respect to the thicknesses of the SIPO electrolyte membranes of the fuel cells were measured, wherein the SIPO electrolyte membrane of Comparative Example 1 was a SIPO press-molded product as described above. The results are shown in FIGS. 8A and 8B. The ASR was measured using a 4-probe AC impedance method. Referring to FIGS. 8A and 8B, the fuel cell of Example 2 has a smaller ASR, as compared to the fuel cell of Comparative Example 1.

Figure 9:
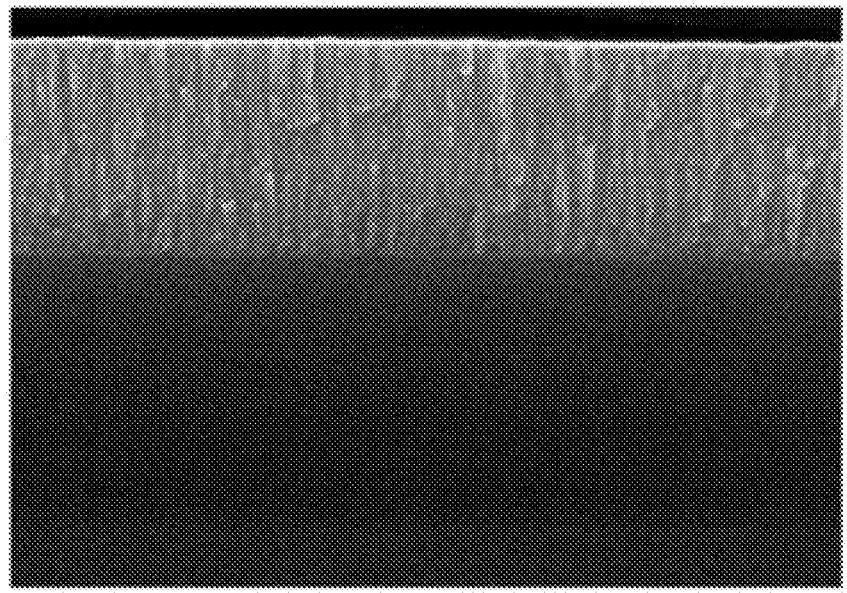
FIG. 9 is a cross-sectional SEM image of a SIPO proton-conductive inorganic thin film formed according to Example 3.

A cross-section of the SIPO proton-conductive inorganic thin film of Example 1 was analyzed by using SEM. The results are shown in FIG. 9.

Figure 10:
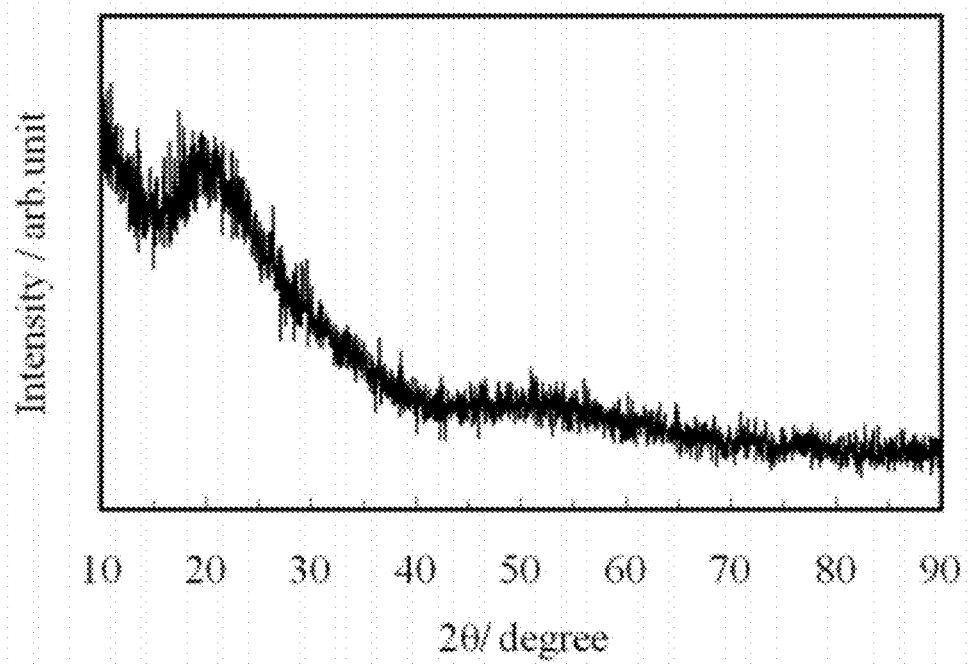
FIG. 10 shows the results of X-ray diffraction (XRD) analysis of the SIPO proton-conductive inorganic thin film of Example 2.
Figure 11:
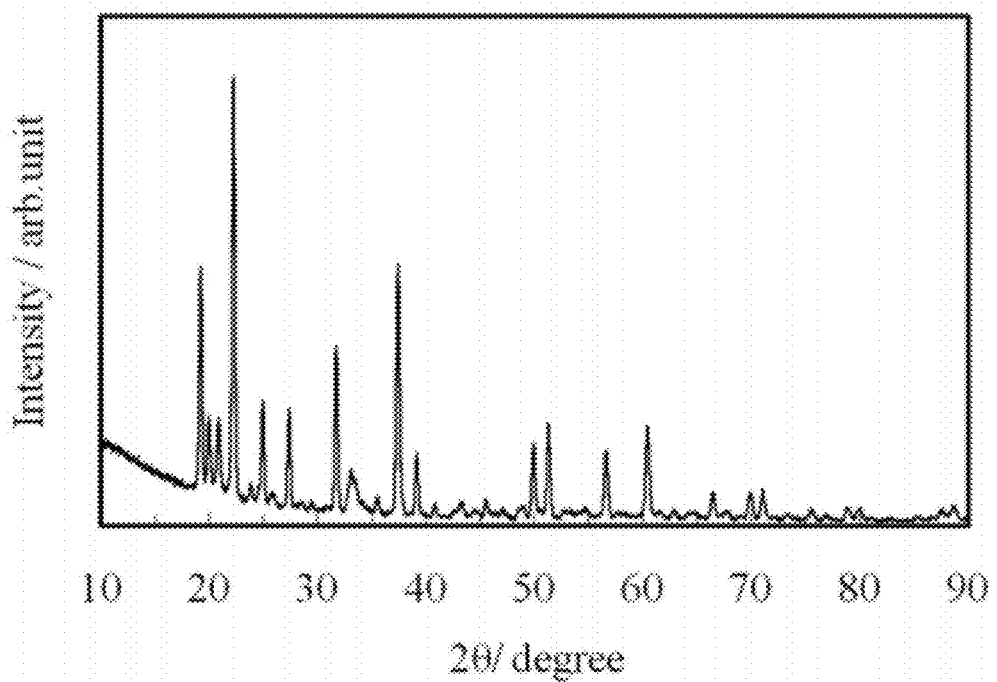
FIG. 11 shows the results of X-ray diffraction (XRD) analysis of the SIPO proton-conductive inorganic thin film of Comparative Example 1.

X-ray diffraction (XRD) analysis was conducted on the SIPO proton-conductive inorganic thin film of Example 2 and the SIPO press-molded electrolyte membrane of Comparative Example 1. The results are shown in FIGS. 10 and 11, respectively. Referring to FIGS. 10 and 11, a crystalline phase of $SnP_2O_7$ is detected from the electrolyte membrane of Comparative Example 1, as opposed to the SIPO proton-conductive inorganic thin film of Example 1.

As described above, according to the one or more of the above exemplary embodiments of the present invention, a proton-conductive inorganic thin film in amorphous phase having good proton conductivity may be formed. In addition, a highly efficient fuel cell may be manufactured using the proton-conductive inorganic thin film.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A fuel cell comprising the proton-conductive inorganic thin film comprising an inorganic proton conductor represented by Formula 1 below:

$$M^1_{1-a}M^2_aP_xO_y,$$ Formula 1 wherein $M^1$ is a tetravalent metallic element, $M^2$ is at least one metallic element selected from the group consisting of a monovalent metallic element, a divalent metallic element, and a trivalent metallic element, $0 \leq a < 1$, x is a number from 1.5 to 3.5; and y is a number from 5 to 13, characterized in that conductive inorganic thin film is in an amorphous phase wherein a main peak at a Bragg angle of $2\theta$ indicating a crystalline phase of $SnP_2O_7$ is not present for a CuK-α X-ray wavelength of 1.541 Å.

2. The fuel cell of claim 1, wherein the proton-conductive inorganic thin film has a thickness of about 0.05 μm to about 10 μm.

3. The fuel cell of claim 1, wherein the proton-conductive inorganic thin film has a density of about 2.7 g/cm³ or greater.

4. The fuel cell of claim 1, wherein a main peak having a Bragg angle of $2\theta$ for a CuK-α X-ray wavelength of 1.541 Å appears broadly in the range from about 15 degrees to about 40 degrees.

5. The fuel cell of claim 1, wherein, at a thickness of about 0.05 μm to about 10 μm, the proton-conductive inorganic thin film has an open circuit voltage (OCV) of about 0.9 V or greater at 200° C., and an area specific resistance (ASR) of about 0.01 Ωcm² to about 1 Ωcm² at 200° C.

6. The fuel cell of claim 1, wherein $M^1$ is at least one metal selected from the group consisting of tin (Sn), zirconium (Zr), tungsten (W), silicon (Si), molybdenum (Mo), and titanium (Ti).

7. The fuel cell of claim 1, wherein $M^2$ is at least one metal selected from the group consisting of lithium (Li), sodium (Na), potassium (K), rubidium (Rb), cesium (Cs), beryllium (Be), magnesium (Mg), calcium (Ca), strontium (Sr), barium (Ba), indium (In), aluminum (Al), and antimony (Sb).

8. The fuel cell of claim 6, wherein $M^1$ is tin (Sn).

9. The fuel cell of claim 1, wherein in Formula 1, a is a number from 0.05 to 0.5.

10. The fuel cell of claim 1, wherein in Formula 1, x is 2, and y is 7.

11. The fuel cell of claim 1, wherein the inorganic proton conductor of Formula 1 is $Sn_{0.9}In_{0.1}P_2O_7$, $Sn_{0.95}Al_{0.05}P_2O_7$, $Ti_{0.9}In_{0.1}P_2O_7$, $Ti_{0.95}Al_{0.05}P_2O_7$, $Zr_{0.9}In_{0.1}P_2O_7$, $Zr_{0.95}Al_{0.05}P_2O_7$, $W_{0.9}In_{0.1}P_2O_7$, $W_{0.95}Al_{0.05}P_2O_7$, $Sn_{0.7}Li_{0.3}P_2O_7$, $Sn_{0.95}Li_{0.05}P_2O_7$, $Sn_{0.9}Li_{0.1}P_2O_7$, $Sn_{0.8}Li_{0.2}P_2O_7$, $Sn_{0.6}Li_{0.4}P_2O_7$, $Sn_{0.5}Li_{0.5}P_2O_7$, $Sn_{0.7}Na_{0.3}P_2O_7$, $Sn_{0.7}K_{0.3}P_2O_7$, $Sn_{0.7}Cs_{0.3}P_2O_7$, $Zr_{0.9}Li_{0.1}P_2O_7$, $Ti_{0.9}Li_{0.1}P_2O_7$, $Si_{0.9}Li_{0.1}P_2O_7$, $Mo_{0.9}Li_{0.1}P_2O_7$, $W_{0.9}Li_{0.1}P_2O_7$, $Sn_{0.7}Mg_{0.3}P_2O_7$, $Sn_{0.95}Mg_{0.05}P_2O_7$, $Sn_{0.9}Mg_{0.1}P_2O_7$, $Sn_{0.8}Mg_{0.2}P_2O_7$, $Sn_{0.6}Mg_{0.4}P_2O_7$, $Sn_{0.5}Mg_{0.5}P_2O_7$, $Sn_{0.7}Ca_{0.3}P_2O_7$, $Sn_{0.7}Sr_{0.3}P_2O_7$, $Sn_{0.7}Ba_{0.3}P_2O_7$, $Zr_{0.9}Mg_{0.1}P_2O_7$, $Ti_{0.9}Mg_{0.1}P_2O_7$, $Si_{0.9}Mg_{0.1}P_2O_7$, $Mg_{0.9}Mg_{0.1}P_2O_7$, $W_{0.9}Mg_{0.1}P_2O_7$, $Zr_{0.7}Mg_{0.3}P_2O_7$, $Ti_{0.7}Mg_{0.3}P_2O_7$, $Si_{0.7}Mg_{0.3}P_2O_7$, $Mg_{0.7}Mg_{0.3}P_2O_7$, or $W_{0.7}Mg_{0.3}P_2O_7$.

12. The fuel cell of claim 1, wherein the proton-conductive inorganic thin film is obtained by vapor-depositing the inorganic proton conductor of Formula 1 on a substrate.

13. A method of forming a fuel cell, the method comprising sputtering an inorganic proton conductor represented by Formula 1 below, on a substrate:

$$M^1_{1-a}M^2_aP_xO_y,$$ Formula 1 wherein

M¹ is a tetravalent metallic element;

M² is at least one selected from the group consisting of a monovalent metallic element, a divalent metallic element, and a trivalent metallic element;

$0 \leq a < 1$;

x is a number from 1.5 to 3.5; and y is a number from 5 to 13, characterised in that conductive inorganic thin film is in an amorphous phase wherein a main peak at a Bragg angle of 2θ indicating a crystalline phase of $SnP_2O_7$ is not present for a CuK-α X-ray wavelength of 1.541 Å; and disposing the inorganic proton conductor in a fuel cell.

14. The method of claim 13, wherein the sputtering is performed by using reactive sputtering.

15. The method of claim 13, wherein the sputtering comprises:

press-molding and thermally treating the inorganic proton conductor of Formula 1 to obtain a sintered product; and performing sputtering on the sintered product as a sputter target.

16. The method of claim 15, wherein the sputtering is performed in a mixed gas atmosphere containing about 10% to about 20% of oxygen by volume and about 80% to about 90% of an inert gas by volume.

17. The method of claim 15, wherein the sputtering is performed at a pressure of about 3 mTorr to about 10 mTorr.

18. The method of claim 15, wherein the depositing further comprises post-heat treatment of the sputtered thin film at a temperature lower than 700° C. after the sputtering.

19. A proton-conductive inorganic thin film comprising an inorganic proton conductor comprising $Ti_{0.95}Al_{0.05}P_2O_7$, $Zr_{0.95}Al_{0.05}P_2O_7$, or $W_{0.95}Al_{0.05}P_2O_7$.

* * * * *